United States Patent [19]
Ryoho et al.

[11] Patent Number: 6,064,327
[45] Date of Patent: May 16, 2000

[54] CONSTANT VOLTAGE GENERATION CIRCUIT

[75] Inventors: Fumihiro Ryoho; Taiki Nishiuchi; Terunori Kubo, all of Tokyo, Japan

[73] Assignees: Mitsubishi Electric Engineering Company Limited; Mitsubishi Denki Kabushiki Kaisha, both of Tokyo, Japan

[21] Appl. No.: 09/006,902

[22] Filed: Jan. 14, 1998

[30] Foreign Application Priority Data

Sep. 4, 1997 [JP] Japan .................................. 9-239759

[51] Int. Cl.⁷ ...................................................... H03M 1/78
[52] U.S. Cl. .......................... 341/154; 341/158; 341/118; 341/120; 341/159; 341/144
[58] Field of Search .............................. 327/530; 307/50; 341/118, 120, 154, 159, 144

[56] References Cited

U.S. PATENT DOCUMENTS

| | | |
|---|---|---|
| 4,794,374 | 12/1988 | Koike . |
| 5,111,205 | 5/1992 | Morlon .................................... 341/156 |
| 5,877,718 | 3/1999 | Andoh et al. ............................ 341/155 |
| 5,920,273 | 7/1999 | Hirano .................................... 341/144 |
| 5,943,000 | 8/1999 | Nessi et al. .............................. 341/154 |

FOREIGN PATENT DOCUMENTS 62-258521  11/1987  Japan .

*Primary Examiner*—Brian Young
*Assistant Examiner*—Jason L W Kost
*Attorney, Agent, or Firm*—Burns, Doane, Swecker & Mathis, LLP

[57] ABSTRACT

A constant voltage generation circuit in which a charging circuit (T1) connected to one side of resistors (LR2 to LR5) rapidly supplies a higher voltage, that is further higher than any voltage generated at each of the resistors (LR2 to LR5), to the output terminal (OT) during a desired time period when one of switches (SW2 to SW4) turns on to provide the voltage to be switched to the output terminal (OT) and when the voltage to be switched is higher than a current voltage of the output terminal (OT). Furthermore, in the circuit, a charging circuit (T2) connected to other side of resistors (LR2 to LR5) rapidly supplies a lower voltage, that is further lower than any voltage generated at each of the resistors (LR2 to LR5), to the output terminal (OT) during a desired time period when one of switches (SW2 to SW4) turns on to provide the voltage to be switched to the output terminal (OT) and when the voltage to be switched is lower than a current voltage of the output terminal (OT).

16 Claims, 6 Drawing Sheets

6,064,327

CONSTANT VOLTAGE GENERATION CIRCUIT

BACKGROUND OF THE INVENTION

1. Field of the Invention

The present invention relates to a constant voltage generation circuit for generating a plurality of voltages and for selecting an optional voltage in the generated voltages and for outputting the selected voltage to outside, and more particularly, to a constant voltage generation circuit for generating a plurality of voltages and for rapidly selecting one of the generated voltages and for supplying a selected one to outside.

2. Description of Related Art

FIG. 5 is a circuit diagram showing a configuration of a conventional constant voltage generation circuit 78. In FIG. 5, the reference characters R51, R52, R53, and R54 designate resistors connected between nodes N51 and N55 in series to form a ladder resistor. The reference characters N51 and N55 denote nodes through which a voltage is supplied to each of the resistor R51 to R54. The reference characters N52, N53, and N54 indicate nodes providing voltages V2, V3, and V4 generated between the resistors R51 and R52, between the resistors R52 and R53, and between the resistors R53 and R54, respectively.

The reference characters SW51, SW52, and SW53 designate switches to select and to provide one of the voltages V2 to V4 at the nodes N52 to N54 to an output terminal OT by connecting the node N56 to one of the nodes N52 to N54. The reference character C51 denotes a parasitic capacitance connected to the node N56, the reference character N56 designates a node through which one of the voltages V2, V3, and V4 at the nodes N52, N53, and N54 selected by one of the switches SW51 to SW53 is provided to the output terminal OT. This reference character OT denotes an output terminal through which one of the voltages V2 to V4 is output to various devices (omitted from the drawing) that are located in following stages and connected to the conventional constant voltage generation device.

Next, a description will be given of the operation of the conventional constant voltage generation circuit.

FIGS. 6A and 6B is a timing chart showing the change of the voltage generated at the node N56 when one of the voltages at the nodes N52, N53, and N54 is supplied to the output terminal OT.

FIG. 6A shows the timing chart of the change of the voltage at the node N56 when the level of the voltage of the node N56 is risen from the voltage V4 to the voltage V3. FIG. 6B shows the timing chart of the voltage at the node N56 when the level of the voltage of the node N56 is fallen from the voltage V2 to the voltage V3.

Hereinafter, a description will be given of the operation of the conventional constant voltage generation circuit 78 in which the voltage at the node N56 is switched from the voltage V4 to the voltage V3 shown in FIG. 6A and also changed from the voltage V2 to the voltage V3 shown in FIG. 6B.

Firstly, as shown in FIG. 6A, a description will be given of the rising operation of a voltage level at the node N56 from the voltage V4 to the voltage V3.

In the case in which only the switch SW53 is in on state and both the switches SW51 and SW52 are in off state and the voltage at the node N56 is the voltage V4, when the switch SW53 turns off and the switch SW52 turns on in order to rise the voltage level at the node N56 to the voltage V3, the voltage at the node N56 will be risen by the voltage difference (V3–V4).

Because the node N56 has a parasitic capacitance C51, the parasitic capacitance C51 is also charged simultaneously when the node N56 is charged. That is, the time Δt1 to reach the voltage of the node N56 to a target level (this target level is the voltage V3 in the example shown in FIG. 6A) is the time required to charge the node N56 by the voltage difference (V3–V4), namely the time required to charge the node N56 by the magnitude of the change of the voltage at the node N56 because it is also required to charge the parasitic capacitance C51 in order to rise the level of the voltage at the node N56. In this case, the level of the voltage V3 of the node N56 is risen by a current flow from the node N53 to the node N56 immediately following the switch SW53 turns off and the switch SW52 turns on, and the level of the voltage V4 at the node N56 is the level before the switches SW53 turns off and SW52 turns on. That is, the magnitude of the time Δt1 depends on the magnitude of a current that flows to the node N56, and determined by the magnitude of the voltage difference (V3–V4), the magnitude of the parasitic capacitance C51, and loads in following stages (omitted from the diagram) connected to this conventional constant voltage circuit 78, during the charging operation.

Next, a description will be given of the operation shown in FIG. 6B when the level of the voltage at the node N56 is switched from the voltage V2 to the voltage V3 in the conventional constant voltage generation circuit 78 shown in FIG. 5.

First, when the voltage at the node N56 is the voltage V2 and the voltage at the node N56 is switched from the voltage V2 to the voltage V3 (namely, the decreasing of the voltage at the node N56), like the case shown in FIG. 6A, it must be required to discharge the voltage at the node N56 and the parasitic capacitance C51. The time Δt2 required to perform this discharging operation is equal to the time required for discharging the voltage difference between the voltage V3 and the voltage V2. In this case, the voltage V3 at the node N56 is obtained by a current flow from the node N56 to the node N53 caused immediately following the switch SW51 turns off and the switch SW52 turns on. The voltage V2 is the voltage at the node N56 before the switch SW51 turns off and the switch SW52 turns on. That is, the magnitude of the time Δt2 depends on the magnitude of a current that flows from the node N56 to the node N53, namely determined by the magnitude of the voltage difference (V3–V4) at the node N56, the magnitude of the parasitic capacitance C51, and loads in following stages (omitted from the diagram) connected to this conventional constant voltage circuit 78, during the discharging operation.

Thus, in the conventional constant voltage generation circuit 78 shown in FIG. 5, the time to switch the output voltage of the output terminal OT through which a voltage is supplied to outside is equal to a voltage difference at the output terminal OT before and after the voltage switching operation that is executed by a current flow from/to one node to/from the output terminal OT. That is, the time required for switching the level of the voltage of the output terminal OT is equal to the charging time required to charge the voltage at the node N56 (when the magnitude of the voltage at the output terminal OT is increased) or equal to the discharging time required for discharging the voltage at the node N56 (when the magnitude of the voltage at the output terminal OT is decreased).

During the charging operation, when the magnitude of the current determined by both the voltage difference in the voltage switching operation and a load connected to a current path is large, the time required to charge the output terminal OT including the parasitic capacitance C51 becomes short.

On the contrary, during the discharging operation, when the magnitude of the above current is large, the time required to discharge the output terminal OT including the parasitic capacitance C51 becomes short because the capacitances stored in both the output terminal OT and the parasitic capacitance C51 are rapidly discharged.

FIG. 7 is a diagram showing a configuration of an analogue/digital (A/D) converter (based on a method of successive comparison) incorporating the conventional constant voltage generation circuit 78 shown in FIG. 5.

In FIG. 7, the reference number 7 designates a path through which a control signal to indicate a reference time is transmitted. The operation of the A/D converter is performed based on the reference time 7. The reference number 78 indicates the conventional constant voltage circuit, as shown in FIG. 5, that inputs voltages of power sources through input terminals 1 and 2, and outputs a desired voltage. The reference number 9 denotes a comparator for comparing a comparison reference voltage 4 with a target voltage 3 for the comparison and for outputting a comparison result. The reference number 10 indicates a data storage circuit for inputting the comparison result and for storing it in order.

Hereinafter, a description will be given of the operation of the A/D converter based on a method of successive comparison incorporating the conventional constant voltage generation circuit 78 shown in FIG. 5.

When receiving the reference voltage 4 generated by and transferred from the constant voltage generation circuit 78, the comparator 9 compares the reference voltage 4 with the target voltage 3 for the comparison in magnitude. Then, the comparator 9 outputs the comparison result 6 to the data storage circuit 10. For example, when the target voltage 3 is greater than the reference voltage 4, the comparator 9 outputs the voltage whose magnitude is the same as that of the voltage of the power source. When it is smaller than the reference voltage 4, the comparator 9 outputs the voltage having the magnitude zero to the data storage circuit 10.

The data storage circuit 10 stores the comparison results transferred from the comparator 9 in the order of reception. That is, the data storage circuit 10 stores a first comparison result, a second comparison result, a third comparison result, ... transferred from the comparator 9 in order. When the comparison result 6 is equal to the voltage of the power source, the data storage circuit 10 stores the data item "1" for the comparison result 6. When the comparison result 6 is the data "zero", the data storage circuit 10 stores the data item "0" for the comparison result 6. That is, because the data storage circuit 10 may store the comparison result from the comparator 9 by using a binary number "0" and "1", it is therefore possible to indicate the comparison result by using the binary number, "1" and "0" in digital form.

On the other hand, the comparison result 6 transferred from the comparator 9 is also transferred to the conventional constant voltage generation circuit 78 through a feedback path from the comparator 9 to the conventional constant voltage generation circuit 78. Following this, the conventional constant voltage generation circuit 78 outputs the reference voltage 4 for comparison that will be compared with the target voltage 3. The magnitude of this reference voltage 4 is determined based on the comparison result 6 transferred from the comparator 9.

For example, in order to indicate that the target voltage 3 is greater than the reference voltage 4 when the magnitude of the reference voltage 4 is a half (VCC/2) of the voltage VCC of the power source, the conventional constant voltage generation circuit 78 outputs a following reference voltage 4 whose magnitude becomes ¾ VCC.

In order to indicate that the target voltage 3 is smaller than the reference voltage 4, the conventional constant voltage generation circuit 78 outputs a following reference voltage 4 whose magnitude becomes ¼ VCC.

Thus, the reference voltage 4 output from the conventional constant voltage generation circuit 78 may be determined by using the comparison result 6 transferred from the comparator 6.

Furthermore, as described above, the reference number 7 designates the control signal to indicate a reference time. The A/D converter operates based on this control signal to indicate the reference time. That is, all of the data storage circuit 10, the conventional constant voltage generation circuit 78, and the comparator 9 incorporated in the A/D converter are performed in synchronization with the control signal. This guarantees the operation of the A/D converter.

There is an A/D converter disclosed in the Japanese patent application JP-A-62/258521 and the U.S. Pat. No. 4,794,374 that corresponds to the JP-A-62/258521 as another example of an A/D converter incorporating the conventional constant voltage generation circuit.

In this conventional example, a bias supply circuit and a fourth switch are placed at a common connection node between a first switch and a second switch incorporated in the A/D converter (a third switch is omitted from this explanation). By using the configuration, a parasitic capacitance belonging or associated with the common connection node may be charged or discharged forcibly and rapidly in a correction operation performed before a voltage switching operation. This configuration provides the conventional A/D converter capable of increasing the value of each resistance for voltage divider and more applicable to MOS integrated circuits having a low power consumption at a high speed rate and with a higher accuracy.

Because the conventional constant voltage generation circuit has the above configuration, when one level of the voltage is switched to another level of the voltage, the time required for the voltage switching operation is determined based on a voltage difference and the magnitude of a current flow when the switching operation of the voltage is performed. Thereby, when a current flowing through the output terminal of the conventional constant voltage generation circuit is small, there is a drawback that it takes a long time to switch the voltage of the output terminal. In addition, the conventional A/D converter discloses in the Japanese Patent Application JP-A-62/258521 has a larger hardware size and a larger power consumption because a bias voltage supply circuit is incorporated in each of a plurality of resistance sections located between a first power source and a second power source.

SUMMARY OF THE INVENTION

Accordingly, an object of the present invention is, with due consideration to the drawbacks of the conventional constant voltage generation circuit, to provide a constant voltage generation circuit having a simple configuration and with a low power consumption that is capable of reducing a time required for the voltage switching operation and that is easily incorporated into available devices.

In accordance with a preferred embodiment of the present invention, a constant voltage generation circuit comprises a plurality of voltage generation means connected in series and both sides of which voltages of power sources being applied, a plurality of switches for selecting voltages generated at nodes among the plurality of voltage generation means in a voltage switching operation and for providing the selected voltage to an output terminal, a first charging means connected to one of the sides of the plurality of voltage generation means for generating and supplying a charging voltage whose level is higher than a level of the highest voltage generated by the plurality of voltage generation means, a first switch for connecting the first charging means to the output terminal during a voltage switching operation in which one of the nodes among the plurality of voltage generation means that is currently connected to the output terminal is switched to other node whose voltage is higher than the current voltage of the output terminal, a first discharging means connected to other side of the plurality of voltage generation means for generating and supplying a discharging voltage whose level is smaller than a level of the lowest voltage generated by the plurality of voltage generation means, and a second switch for connecting the first discharging means to the output terminal during a voltage switching operation in which one of the nodes among the plurality of voltage generation means that is currently connected to the output terminal is switched to other node whose voltage is lower than the current voltage of the output terminal.

In accordance with another preferred embodiment of the present invention, a constant voltage generation circuit comprises a plurality of voltage generation means connected in series and both sides of which voltages of power sources being applied, a plurality of switches for selecting voltages generated at nodes among the plurality of voltage generation means in a voltage switching operation and for providing the selected voltage to an output terminal, a second charging means placed in a section separated from the plurality of voltage generation means and for generating and supplying a charging voltage whose level is higher than a level of the highest voltage generated by the plurality of voltage generation means, a third switch for connecting the second charging means to the output terminal during a voltage switching operation in which one of the nodes among the plurality of voltage generation means that is currently connected to the output terminal is switched to other node whose voltage is higher than the current voltage of the output terminal, a second discharging means placed in a section separated from the plurality of voltage generation means and for generating and supplying a discharging voltage whose level is smaller than a level of the lowest voltage generated by the plurality of voltage generation means, and a fourth switch for connecting the first discharging means to the output terminal during a voltage switching operation in which one of the nodes among the plurality of voltage generation means that is currently connected to the output terminal is switched to other node whose voltage is lower than the current voltage of the output terminal.

The constant voltage generation circuit as another preferred embodiment according to the present invention, further comprises control means for controlling operations of the plurality of switches, the first switch, the second switch, the third switch, and the fourth switch so that the first charging means or the second charging means is electrically connected to the output terminal, or the first discharging means or the second discharging means is electrically connected to the output terminal during any one of the plurality of voltage generation means is not connected to the output terminal in the voltage switching operation.

In the constant voltage generation circuit as another preferred embodiment according to the present invention, during the voltage switching operation, the control means controls a switching operation of the plurality of switches, the first switch, the second switch, the third switch, and the fourth switch so that the first charging means or the second charging means is electrically connected to the output terminal and the first discharging means or the second discharging means is electrically connected to the output terminal during a charging operation or a discharging operation for the output terminal and during a time period overlapped to a time period before one of the plurality of voltage generation means is electrically disconnected from the output terminal at a start of the voltage switching operation.

In the constant voltage generation circuit as another preferred embodiment according to the present invention, during the voltage switching operation, the control means controls a switching operation of the plurality of switches, the first switch, the second switch, the third switch, and the fourth switch so that the first charging means or the second charging means is electrically connected to the output terminal and the first discharging means or the second discharging means is electrically connected to the output terminal during a charging operation or a discharging operation for the output terminal and during a time period overlapped to a time period after one of the plurality of voltage generation means is electrically connected to the output terminal at a completion of the voltage switching operation.

In the constant voltage generation circuit as another preferred embodiment according to the present invention, each of the first charging means, the second charging means, the first discharging means, and the second discharging means comprises a metal oxide semiconductor transistor.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of the constant voltage generation circuit according to the present invention will now be described with reference to the drawings.

First Embodiment

Figure 1:
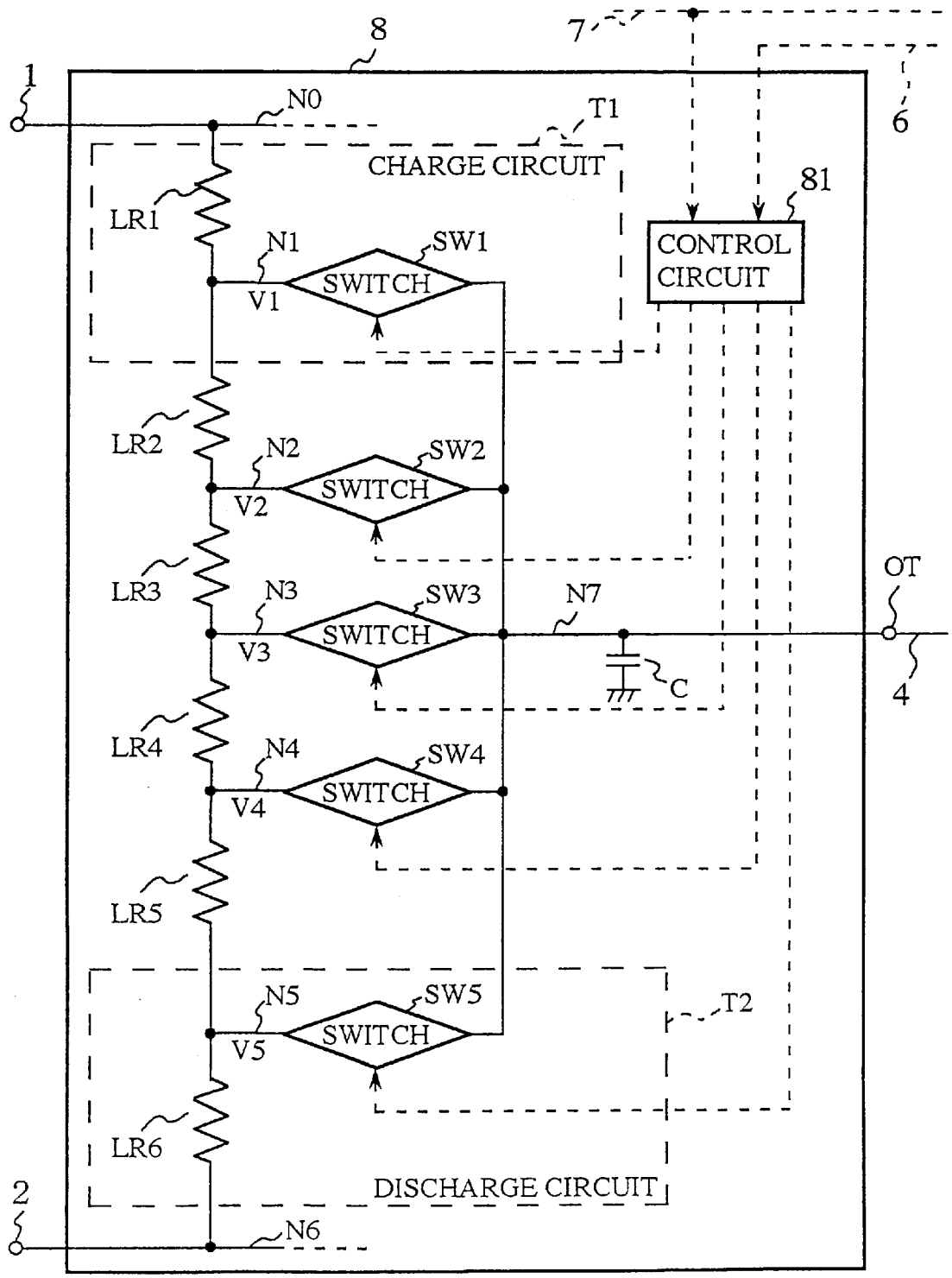
FIG. 1 is a circuit diagram showing a configuration of a constant voltage generation circuit according to the first embodiment of the present invention.

FIG. 1 is a circuit diagram showing a configuration of a constant voltage generation circuit 8 according to the first embodiment of the present invention. In FIG. 1, the reference characters LR1, LR2, LR3, LR4, LR5, and LR6 designate resistors forming a ladder resister in which the resistors are connected in series between nodes N0 and N6. The reference characters N0 and N6 denote nodes through which voltages of power sources are supplied to each of the resistors LR1 to LR6. The reference characters N1, N2, N3, N4, and N5 denote nodes through which the voltage V1, V2, V3, V4, and V5 generated between the pair of the resistors LR1 and LR2, the pair of the resistors LR2 and LR3, the resistors LR3 and LR4, and the pair of the resistors LR4 and LR5 are supplied, respectively. The reference characters SW1, SW2, SW3, SW4, and SW5 designate switches for selecting one of the voltages V1 to V5 by a voltage switching operation in which a node 7 is connected to one of the nodes N1 to N5. The reference character C designates a parasitic capacitance belonging to or associated with the node N7. This reference character N7 indicates the node through which one of the voltages V1 to V5 selected one of the switches SW1 to SW5 is supplied to the output terminal OT. This reference character OT designates the output terminal connected to the node N7 in the constant voltage generation circuit through which one of the voltages V1 to V5 is provided to devices in following stages (omitted from the diagram).

The reference character T1 designates a charge circuit to supply a voltage V1, that is the highest supply voltage in the constant voltage generation circuit, to the node N7 and the parasitic capacitance C. The reference character T2 designates a discharge circuit to supply a voltage V5, that is the lowest supply voltage in the constant voltage generation circuit, to the node N7 and the parasitic capacitance C. The reference number 81 designates a control circuit to control the operation of the switches SW1 to SW5. For example, when the constant voltage generation circuit of the first embodiment shown in FIG. 1 is incorporated in the A/D converter shown in FIG. 7, the control circuit 81 receives a control signal 7 to indicate a reference time (all elements operate in synchronization with this reference time. This control signal 7 has been explained in the prior art section) and the comparison result 6 from the comparator 9 in the A/D converter shown in FIG. 7 and then controls the operation of the switches SW1 to SW5 based on the received control signal 7 and the comparison result 6, as shown by dotted lines in FIG. 1.

Next, a description will be given of the operation of the constant voltage generation circuit as the first embodiment.

FIGS. 2A to 2F are timing charts showing the change of a voltage generated at the node N7 through which an optional voltage is supplied to the output terminal OT.

Figures 2A, 2B, 2C, 2D, 2E, 2F:
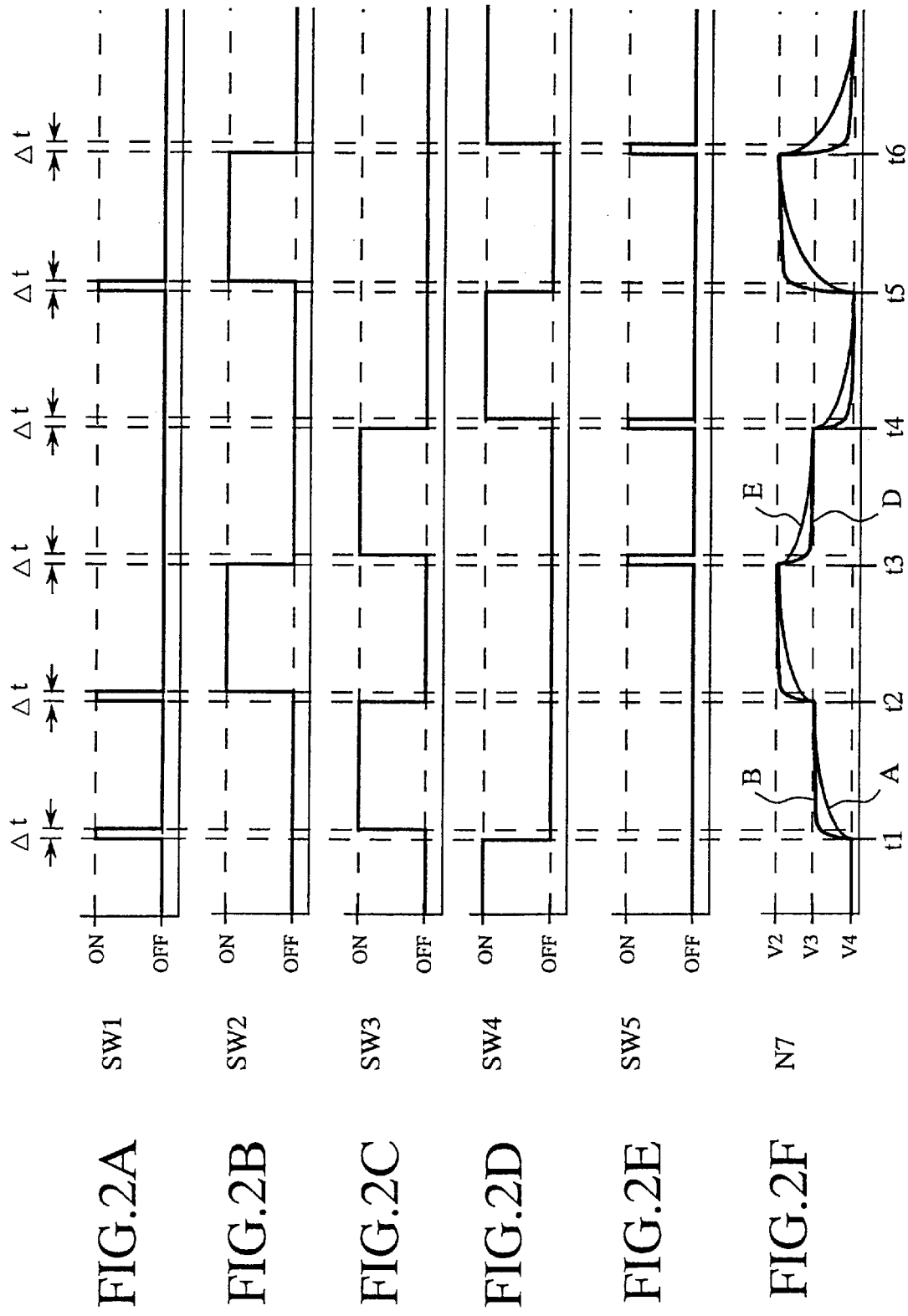
FIGS. 2A to 2F are timing charts showing the change of a voltage generated at a node through which an optional voltage is supplied to an output terminal in the constant voltage generation circuit as the first embodiment shown in FIG. 1.

FIG. 2A is the timing chart showing ON/OFF operation of the switch SW1. FIG. 2B is the timing chart showing ON/OFF operation of the switch SW2. FIG. 2C is the timing chart showing ON/OFF operation of the switch SW3. FIG. 2D is the timing chart showing ON/OFF operation of the switch SW4. FIG. 2E is the timing chart showing ON/OFF operation of the switch SW5. FIG. 2F is the timing chart showing the change of the voltage at the node N7. In FIGS. 2A to 2F, the timings t1, t2, t3, t4, t5, and t6 show the times at which the voltage is switched.

First, it will be explained that the current voltage V4 of the node N7 is switched at the timing t3 to the voltage V3 that is higher than the voltage V4.

In this case, under the control circuit 81, the switch SW4 in on state turns off at the timing t1 and the switch SW3 in off state turns on simultaneously. Thereby, the voltage at the node N7 is changed from the voltage V4 to the voltage V3. Because the change of the voltage of the node N7 has a large time constant, that has already been described in the prior art section, the change of the voltage at the node N7 traces the curve A shown in FIG. 2F, so that the time required to perform the voltage switching operation becomes long. In order to avoid this drawback, the control circuit 81 in the constant voltage generation circuit as the first embodiment operates so that the switch SW1 in the charge circuit T1 turns on during an optional time period Δt during a time period in which the node N7 is not connected to other nodes N2 to N4, namely, during the time period in which the switch SW3 does not turn on immediately following the switch SW4 turned off at the timing t1. Thereby, the node N7 is connected to the node N1 whose voltage level is higher than that of other node during this time period. Thereby, a current flows from the node N1 to the node N7, so that the node N7 and the parasitic capacitance C are rapidly charged.

As described above, under the control of the control circuit 81, the node N7 is temporarily connected to the node N1 during the time period in which the switch SW3 does not turn on immediately following the switch SW4 turns off. In the constant voltage generation circuit of the first embodiment, during the short time period before/after the voltage switching operation the voltage difference becomes the (V1−V4) and a load of the current path becomes only LR1. When comparing with the conventional case in which the voltage difference is (V3−V4) and the load of the current path is (LR1+LR2+LR3), the circuit of the first embodiment has the larger voltage difference during the short time period and the small load in the current path. Accordingly, the magnitude of the current that flows into the node N7 may be increased in the constant voltage generation circuit of the first embodiment. Thereby, the switching speed of the voltage at the node N7 including the parasite capacitance C may be increased, namely the time constant of the change of the voltage may be decreased, so that the level of the voltage at the node N7 rapidly increased along the curve B shown in FIG. 2F. It is thereby possible to decrease the voltage charging time at the node N7 including the parasite capacitance C. That is, it is possible to increase the speed of the voltage switching.

After this, the control circuit 81 generates and transfers a control signal to the switch SW1 so that the switch SW1 turns off when the level of the voltage at the node N7 approximately reaches the level of the target voltage V3. Thereby, the node N7 is electrically disconnected from the node N3. Immediately following this operation, the control circuit 81 transfers a control signal to the switch SW3 so that the switch SW3 turns on. Thereby, the level of the voltage at the node N7 may keep the level of the voltage V3 provided by the node N3.

The voltage switching operation executed at the time t2 when the voltage of the node N7 is switched from the voltage V3 to V2, and the voltage switching operation performed at the time t5 when the voltage of the node N7 is switched from the voltage V4 to V2 is performed are basically equal to the voltage switching operation of the case described above. That is, the control circuit 81 controls the switches SW1 to SW5 so that the node N7 is electrically connected to the node N1 only during an optional time period Δt immediately following the nodes N2 and N3 are electrically disconnected to the node N7. This causes that the node N7 and the parasitic capacitance C may be charged rapidly during the time period Δt by the voltage V1 that is greater than the voltage V2 or V3. It is thereby possible to reduce the charging time period to the node N7 and the parasitic capacitance C.

On the contrary, when the voltage at the node N7 is increased from the voltage V2 to the voltage V3 at the time t3 shown in FIG. 2F, firstly, the control circuit 81 transfers a control signal to the switch SW2 (that is currently in the on state) so that the switch SW2 will turns off and the node N2 (that is now connected to the node N7) will be electrically disconnected to the node N7. After this, under the control of the control circuit 81, the switch SW3 in the off state turns on, so that the switch SW5 for the discharge circuit T2 will turn on during an optional time period Δt before the node N7 will be connected electrically to the node N3 of the voltage V3 that is the target voltage in this voltage switching operation. This causes to connect the node N7 to the node N5 whose voltage level is smaller than that of the voltage V3 only during the time period Δt. Thereby, during the discharging time period Δt, the magnitude of a current flowing through the node N7 to the node N5 may be obtained by the magnitude of the voltage difference (V2−V5) and the value of the resistance LR6. In the constant voltage generation circuit of the first embodiment, when comparing with the case in which the voltage difference is (V2−V3) and the load of the discharging current path is (LR4+LR5+LR6), the circuit of the first embodiment may have the larger voltage difference during the short time period Δt and the small load in the current path. Accordingly, the magnitude of the discharging current that flows through the node N7 to the node N5 may be increased and the time period of the discharging operation becomes short, namely the time constant of the curve indicating the voltage switching operation becomes small, so that the time period of the voltage switching operation may be decreased in the constant voltage generation circuit of the first embodiment.

Figure 5:
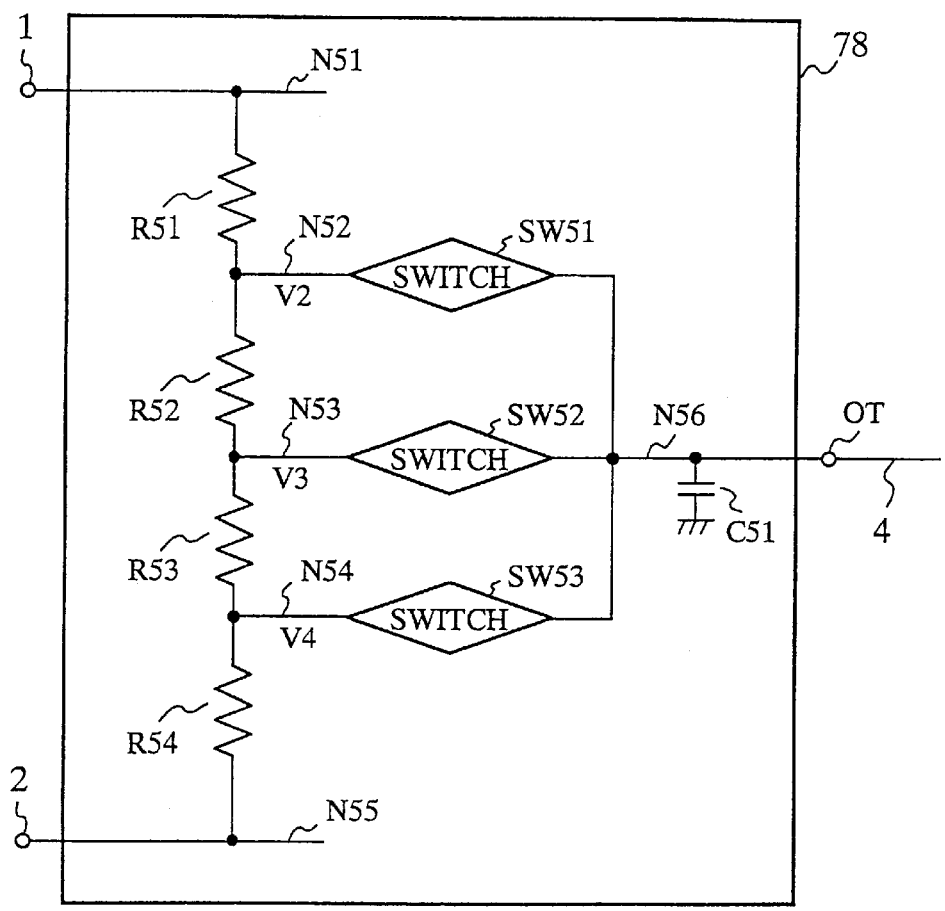
FIG. 5 is a circuit diagram showing a configuration of a conventional constant voltage generation circuit.

As described above, the characteristic curve of the voltage at the node N7 has the curve E in the conventional constant voltage generation circuit 78 shown in FIG. 5. On the contrary, the characteristic curve of the voltage at the node N7 has the curve D in the constant voltage generation circuit 8 of the first embodiment shown in FIG. 1.

That is, because the constant voltage generation circuit 8 of the first embodiment may flow a large current during the discharging operation, the voltage at the node N7 may be rapidly decreased through the curve D when comparing with the conventional one designated by the curve E. The control circuit 81 transfers control signals to the switches SW3 and SW5 so that the switch SW3 turns on and the switch SW5 turns off when the voltage at the node N7 is decreased to the target voltage, namely decreased to the voltage V3. Thereby, the node N7 is electrically connected to the node N3. Therefore the voltage potential of the node N7 may be decreased rapidly through the curve D shown in FIG. 2F.

The same discharge operation described above is performed in other cases, for example, the level of the voltage at the node N7 is switched from the voltage V3 to the voltage V4 designated by the time t4 or from the voltage V2 to the voltage V4 designated by the time t6.

Next, a description will be given of a case in which the constant voltage generation circuit 8 of the first embodiment is incorporated into the A/D converter shown in FIG. 7.

Figure 7:
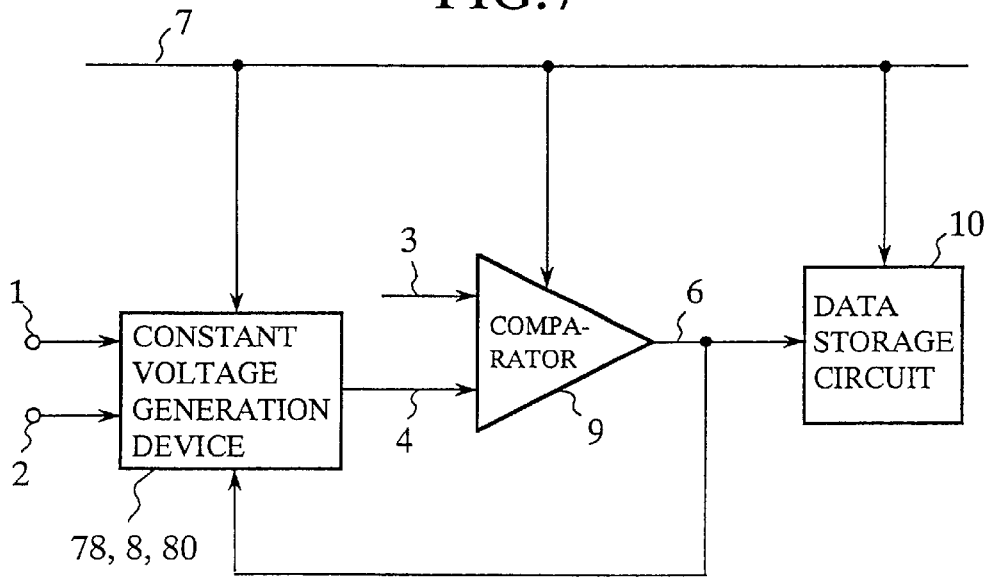
FIG. 7 is a diagram showing a configuration of an A/D converter incorporating the conventional constant voltage generation circuit based on a method of successive comparison.
Figure 6A:
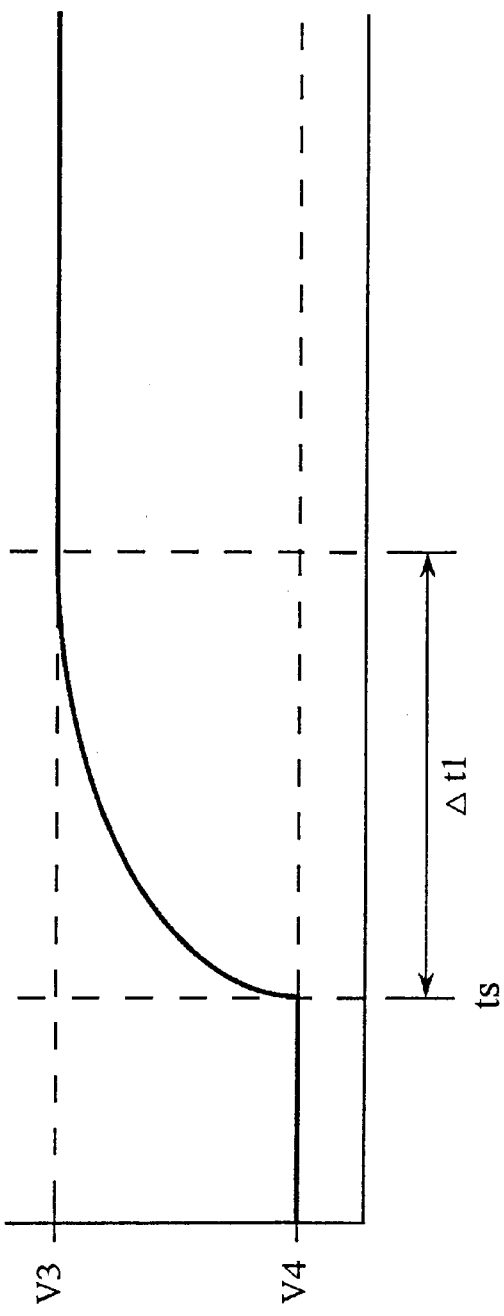
FIGS. 6A and 6B are timing charts of the change of a voltage at a node through which an optional voltage is supplied to an output terminal of the conventional constant voltage generation circuit.
Figure 6B:
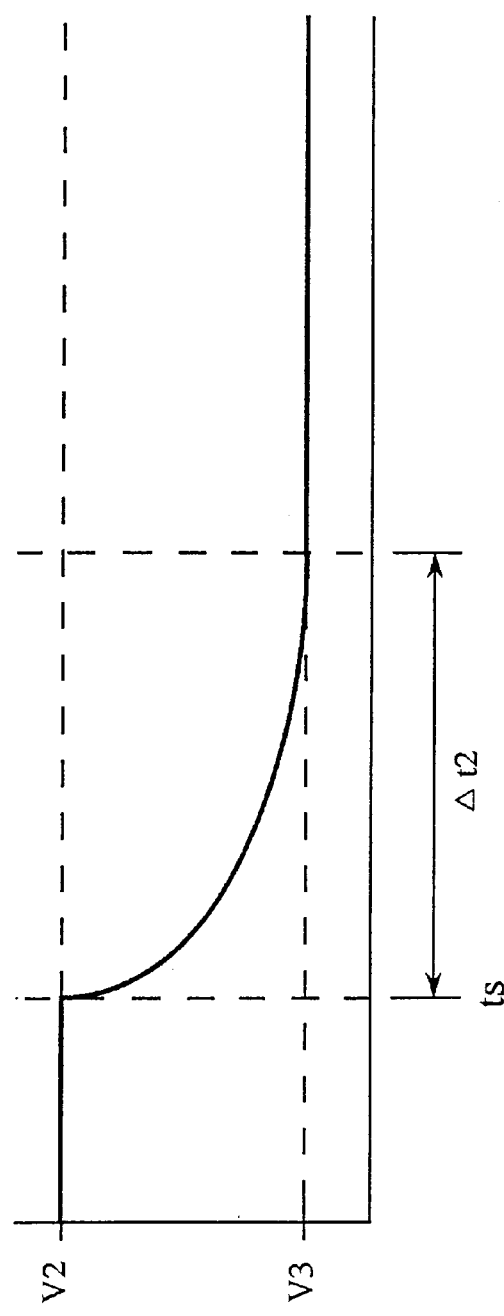

FIG. 7 is the diagram showing the configuration of the A/D converter based on a method of successive comparison incorporating the constant voltage generation circuit 8 of the first embodiment. Although FIG. 7 has already been used in the explanation of the A/D converter incorporating the conventional constant voltage generation circuit 78. The constant voltage generation circuit of the first embodiment may be incorporated in this A/D converter without any changing of the configuration of the A/D converter.

In FIG. 7, the reference number 7 designates a path through which a control signal to indicate a reference time is transmitted to the configuration elements such as the constant voltage generation circuit 80 in the A/D converter. The operation of the A/D converter is performed based on the reference time 7. The reference number 8 indicates the constant voltage circuit of the first embodiment shown in FIG. 1, that inputs voltages of power sources through input terminals 1 and 2 and outputs a desired voltage. The reference number 9 denotes the comparator for comparing a comparison reference voltage 4 with a target voltage 3 for the comparison and for outputting a comparison result 6. The reference number 10 indicates the data storage circuit for inputting the comparison result and for storing it in order.

In the A/D converter incorporating the conventional constant voltage generation circuit 78, each of the configuration elements such as the constant voltage generation circuit 78, the comparator 9, and the like are driven in synchronization with the control signal 7. The comparator 9 receives the reference voltage 4 for comparison and outputs the comparison result 6. A reference voltage 4 to be used in a following comparison operation executed by the comparator 9 is selected based on the comparison result 6 by the constant voltage generation circuit 78 and transferred to the comparator 9.

On the other hand, the A/D converter incorporating the constant voltage generation circuit 8 of the first embodiment has following functions:

Function to generate the reference voltage 4, by the constant voltage generation circuit 8, that will be used in a following comparison operation based on the comparison result 6 (this function is the same of the function of the A/D converter incorporating the conventional constant voltage generation circuit 78);

Function to select one of the charge circuit T1 and the discharge circuit T2 to perform the charge/discharge operations; and Function to execute one of the charge circuit T1 and the discharge circuit T2 before the constant voltage generation circuit 8 generates a reference voltage 4 to be used in a following comparison operation executed by the comparator 9.

It is possible based on the comparison result 6 (FIG. 1 shows the signal path of the comparison result 6 designated by the dotted line) by the control circuit 81 to determine whether the level of the reference voltage 4 to be used in a following comparison operation will be higher or lower than that of the reference voltage 4 that has already been generated and h been used by the comparator 9. That is, it is not required to add any control line if the control circuit 81 operates one of the charge circuit T1 and the discharge circuit T2 based on the received comparison result 6 before the control voltage generation circuit 8 outputs the following reference voltage 4 at the time when the control signal 7 (provided through the signal path designated by the dotted line shown in FIG. 7) gives a following setting time. That is, it is possible to provide the A/D converter having the constant voltage generation circuit 8 capable of switching the reference voltage at a high speed by using available signal lines for the control signal 7 and the comparison result 6.

By the way, as shown in the timing charts of FIGS. 2A to 2F and as has been described in the explanation of the operation of the constant voltage generation circuit 8 as the first embodiment shown in FIG. 1, the control circuit 81 controls the on/off operation of the switches SW1 and SW5 for the charge circuit T1 and the discharge circuit T2 in the rapid charging/discharging operation during the time period in which the node N7 is not connected to other nodes N2 to N4 immediately following one node connected to the node N7 is electrically disconnected from the node N7 and before the voltage level at the node N7 is switched to another voltage level (as a target voltage level of the voltage switching operation). Thereby, the switching operation among the node N7 connected to the output terminal OT and the nodes N1 and N5 may be performed under the control of the control circuit 81.

However, in order to further decrease the time required for the voltage switching operation in the above described case, the time period in which the node N7 is connected to the node N1 or N5 for the rapid charging operation or the rapid discharging operation is not limited to the time period in which the node N7 is not electrically connected to both nodes, one node was connected to the node N7 before a start of the voltage switching operation and the other node will be connected to the node N7 after the completion of the voltage switching operation. That is, the time period in which the node N7 is connected to the node N1 or the node N5 in order to rapidly increase the charging/discharging speed for the node N7 including the parasitic capacitance C may be overlapped to the time in which the node N1 or the node NS is electrically connected to the node N7 before the voltage switching operation is initiated under the control of the control circuit 81.

Furthermore, it is also acceptable to electrically disconnect the node N7 from the node N1 or the node N5 after the target node of the voltage switching operation is connected to the node N7. Thus, it is acceptable that the time period in which the node N7 connected to the output terminal OT is electrically connected to the node N1 or the node NS in order to increase the charging/discharging speed and to decrease the voltage switching speed is overlapped to the time period in which the node was connected to the node N7 before the voltage switching operation to switch the reference voltage 4 to be used for the comparison operation in the comparator 9 is initiated and is also overlapped to the time period in which the target node will be electrically connected to the node N7 after the voltage switching operation is completed. Those operations are controlled easily by the control circuit 81 incorporated in the constant voltage generation circuit 8 of the first embodiment based on the comparison result 6 and the control signal 7.

Furthermore, in order to increase the speed of the voltage switching operation, it is not limited to use other nodes to be connected to the node N7, namely to the output terminal OT instead of the nodes N1 and N5. For example, as shown in FIG. 2, in the timing t1 at which the output voltage is switched from the voltage V4 to the voltage V3, the node N7 is connected to the node N1 in order to increase the charging speed and to decrease the voltage switching time. But, it is acceptable to select other node if the level of the voltage of other node is greater than the level of the voltage of the target node for the voltage switching operation. For example, it is acceptable to use the node N2 having the voltage V2 instead of the charging circuit T1.

On the contrary, in the timing t3 shown in FIG. 2F, it is also acceptable to use the node 4 having the voltage V4 that is smaller in voltage than the voltage V3 of the target node N3 instead of the node N5 of the discharging circuit T2 in order to increase the discharging speed.

Furthermore, the present invention does not limit the configuration of the charging circuit T1 and the discharging circuit T2 described above, it is acceptable to use other means capable of generating any voltage, for example to use only switches instead of the charging circuit T1 and the discharging circuit T2. Moreover, it is acceptable to use capacitors or active element to generate voltages instead of the voltage generation means LR1 to LR4.

As described above, according to the first embodiment, it is possible to decrease the voltage switching time period with a simple configuration because the constant voltage generation circuit 8 has the configuration comprising: a plurality of switches, connected to a ladder resister both sides of which are connected to power sources, by which one of resistors in the ladder resister is connected to the output terminal OT of the constant voltage generation circuit 8; the charging circuit, connected between the resistance having the maximum resistance value in the ladder resister and the output terminal OT, for supplying the voltage that is greater in magnitude than the maximum resistance value in the ladder resister to the output terminal OT by the switching operation; and the discharging circuit, connected between the resistance having the minimum resistance value in the ladder resister and the output terminal OT, for supplying the voltage that is smaller in magnitude than the minimum resistance value in the ladder resister to the output terminal OT by the switching operation.

Furthermore, according to the constant voltage generation circuit 8 of the first embodiment, it is not always required to control exactly the entire control operation of the constant voltage generation circuit because the switching operation for the charging circuit T1 and the discharging circuit T2 may be overlapped in time to the time period required for the voltage switching operation.

Moreover, according to the constant voltage generation circuit 8 of the first embodiment, even if the charging or discharging operation of the node N7 and the parasitic capacitance C connected to the output terminal OT can not be completed during a desired time period when the voltages of the power sources applied to both the node N0 and N6 of the resistors LR1 and LR6 is small in magnitude and when the magnitude of a current flowing between the node N7 and one of the nodes N2 to N4 through which one of target voltages generated at the resistors LR2 to LR4 as the voltage generation means is supplied to the node N7 is small by the voltage drop generated at the resistors LR1 to LR6, the maximum voltage is supplied to the node N7 by the charging circuit T1 or the discharging circuit T2 in order to charge or discharge the node N7 and the parasitic capacitance C. It is possible to decrease the time period required for the charging and discharging operation to the node N7 and the parasitic capacitance C.

Second Embodiment

Figure 3:
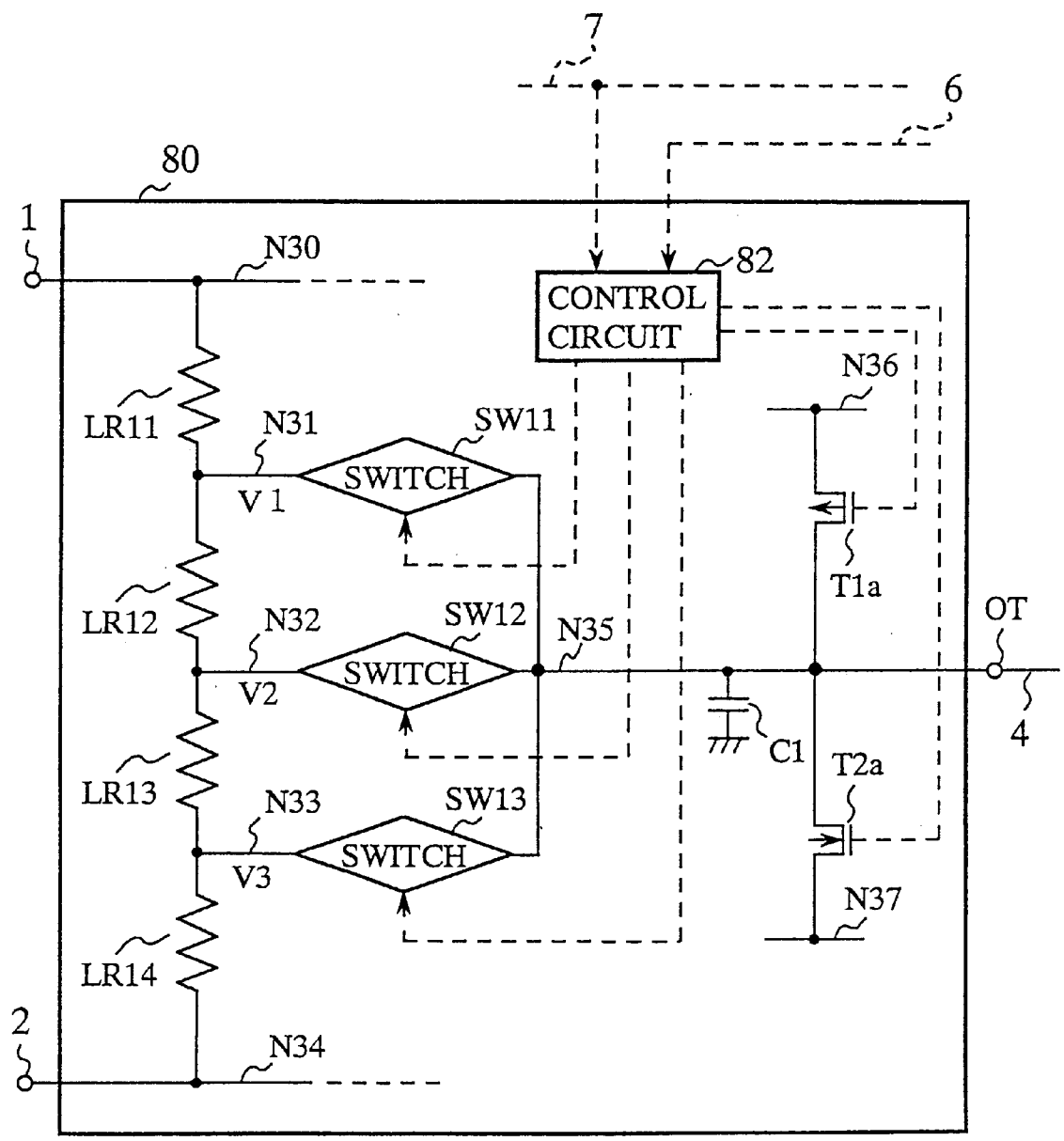
FIG. 3 is a circuit diagram showing a configuration of a constant voltage generation circuit according to the second embodiment of the present invention.

FIG. 3 is a circuit diagram showing a configuration of the constant voltage generation circuit according to the second embodiment of the present invention. In FIG. 3, the reference characters LR11, LR12, LR13, and LR14 designate resistors forming a ladder resister in which the resistors LR11 ro LR14 are connected in series between nodes N0 and N4. The reference characters N30 and N34 denote nodes through which voltages of power sources are supplied to each of the resistors LR1 to LR4. The reference characters N31, N32, and N33 denote nodes through which the voltage V1, V2, and V3 generated between the pair of the resistors LR11 and LR12, the pair of the resistors LR12 and LR13, and the resistors LR13 and LR14 are supplied, respectively. The reference characters SW11, SW12, and SW13 designate switches for selecting one of the voltages V1 to V3 by a switching operation in which a node 35 is connected to one of the nodes N31 to N33. The reference character C1 designates a parasitic capacitance connected to the node N35. This reference character N35 indicates the node through which one of the voltages V11 to V13 selected one of the switches SW11 to SW13 is supplied to the output terminal OT. This node 35 is also connected to a charging circuit T1a and a discharging circuit T2a and further connected to the node N36 and the node N37 through the charging circuit T1a and the discharging circuit T2a, respectively. Thus, the charging circuit T1a and the discharging circuit T2a are separated from the ladder resister comprising the resistors LR11 to LR14. This is different from the first embodiment in configuration. The reference character OT designates the output terminal connected to the node N35 in the constant voltage generation circuit 80 through which one of the voltages V1 to V3 is provided to devices in following stages (omitted from the diagram). For example, each of a charging circuit T1a and a discharging circuit T2a incorporated in the constant voltage generation circuit 80 of the second embodiment comprises a MOS transistor.

In order to charge the node N35 and the parasitic capacitance C1 to a target voltage during the charging operation, a current flows from the power source to the node N35 and the parasitic capacitance C1 through the charging circuit T1a and the node N36. In order to discharge the node N35 and the parasitic capacitance C1 to a target voltage during the discharging operation, a current flows from the node N35 and the parasitic capacitance C1 to the power source through the discharging circuit T2a and the node N37. Thus, by the charging circuit T1a, the node N35 and the parasitic capacitance C1 are charged rapidly to the target voltage. Further, by the discharging circuit T2a, the node N35 and the parasitic capacitance C1 are discharged rapidly to the target voltage. The reference number 82 designates a control circuit to control the operation of each of the switches SW11 to SW13 and the MOS transistors T1a and T2a.

For example, when the A/D converter shown in FIG. 7 incorporates the constant voltage generation circuit 80 of the second embodiment, the control circuit 82 receives the control signal 7 and the comparison result 6 from the comparator 9 in the A/D converter shown in FIG. 7 and controls the operation of the switches SW11 to SW13 and the charging circuit T1a and the discharging circuit T2a based on the received control signal 7 and the comparison result 6 as shown by the dotted lines in FIG. 3.

Next, a description will be given of the operation of the constant voltage generation circuit 80 of the second embodiment.

Figures 4A, 4B, 4C:
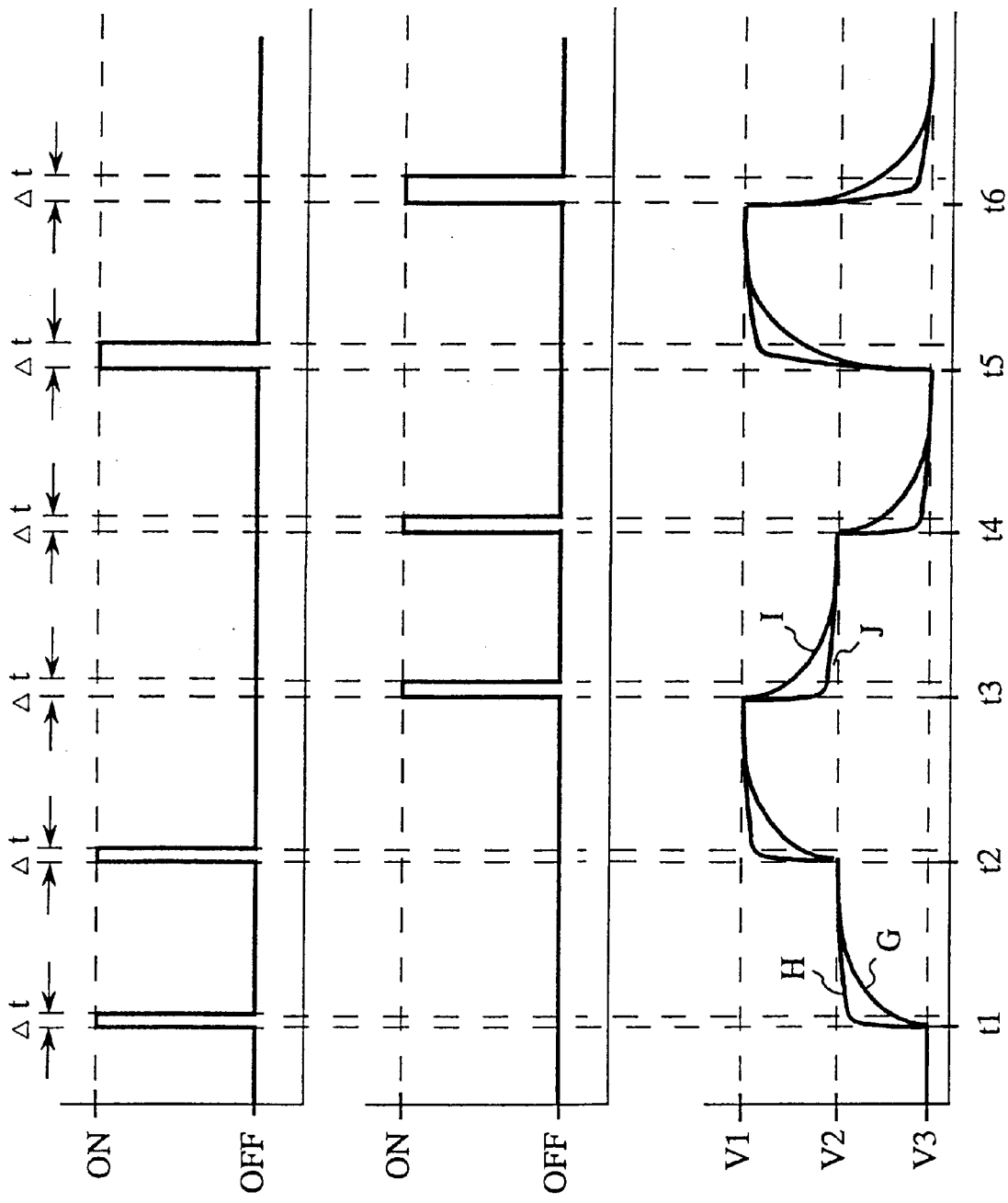
FIGS. 4A to 4C are timing charts showing the change of a voltage generated at a node through which an optional voltage is supplied to an output terminal in the constant voltage generation circuit as the second embodiment shown in FIG. 3.

FIGS. 4A to 4C are timing charts showing the change of a voltage generated at the node N35 through which an optional voltage is supplied to the output terminal OT in the constant voltage generation circuit 80 as the second embodiment shown in FIG. 3. FIG. 4A is the timing chart showing the on/off operation of the charging circuit T1a. FIG. 4b is the timing chart showing the on/off operation of the discharging circuit T2a. FIG. 4C is the timing chart of the change of the voltage generated at the node N35.

First, a description will be given of the operation of the constant voltage generation circuit 80 at the timing t1 when the voltage at the node N35 is switched from the voltage V3 to the voltage V2 shown in FIG. 4C.

Under the control of the control circuit 82, the switch SW13 in the on state turns off. The node N33 is electrically disconnected to the node N35. In this situation, when the switch SW12 in the off state turns on and then connected to the node N35 electrically under the control of the control circuit 82, the voltage of the node N35 changes along the curve G having a large time constant shown in FIG. 4C.

When the control circuit 82 controls to operate the charge circuit T1a during the time period after the switch SW12 in the on state turns off and before the switch SW12 in the off state turns on so that the node N32 will be electrically connected to the node N35, a current flows through the node N36 to the node N35 rapidly. In the second embodiment like the first embodiment of the present invention, it is possible to charge rapidly the node N35 and the parasitic capacitance C1 when the charging circuit (MOS transistor) T1a having a large current amplification factor or having an on-resistance is used. This causes to increase the charging time period and also to decrease the voltage switching time.

As shown by the curve H in FIG. 4C, it is possible to increase the voltage at the node N35 along the curve having the small time constant in the constant voltage generation circuit 80 of the second embodiment.

It is possible to perform the same manner described above for the cases in which the voltage of the node N35 is switched from the voltage V2 to the voltage V1 at the timing t2 and the voltage at the node N35 is switched from the voltage V3 to the voltage V1 at the timing t5, as shown in FIG. 4C. In those case, the control circuit 82 controls the operation of the switches so that the charging circuit T1a tunes on during the time period $\Delta t$ after the switch SW2 or SW3 in the on state turns off (after the node N32 or N33 is electrically disconnected to the node N35) and before the switch SW11 in the off state turns on (before the node N31 is electrically connected to the node N35). Thereby, it is possible to reduce the charging time period to charge the node N35 and the parasitic capacitance C1 when comparing with the conventional case in which the node N35 is connected only to the node N31 of the target voltage V1, because the current rapidly flows from the node N36 to the node N35 during the time period $\Delta t$ in the constant voltage generation circuit 80 of the second embodiment like the first embodiment.

Next, a description will be given of the case in which the target voltage V2 is lower than the current voltage V3 of the node N35 in the voltage switching operation.

As shown in FIG. 4C, we will consider the case in which the switch SW11 in the on state turns off at the timing t3, so that the node N31 is electrically disconnected from the node N35.

When the switch SW12 in the off state turns on, the node N32 is electrically connected to the node N35. In this case, the voltage at the node N35 changes along the curve G having a large time constant shown in FIG. 4F.

In the second embodiment, like the first embodiment, the control circuit 82 transfers a control signal to the discharging circuit T2a so that the discharging circuit T2a turns on during the time period $\Delta t$ after the switch SW11 in the on state turns off (after the node N31 is electrically disconnected from the node N35) and before the switch SW13 in the off state turns on (before the node N31 is electrically connected to the node N35). This causes to flow a current rapidly from the node N35 to the node N37 during the time period Δt, namely the voltage at the node N35 is rapidly discharged. Thus, when the discharging circuit T2a comprises a MOS transistor having a smaller on resistance, the discharging speed may be greatly increased when comparing with the conventional one in which the node N35 is connected only to the node N33 through which the target voltage V3 of the voltage switching operation is supplied. That is, the second embodiment, it is possible to rapidly decrease the level of the voltage at the node N35 along the curve J having a small time constant shown in FIG. 4F.

It is possible to apply the same manner of the above example of the second embodiment to the cases in which the voltage at the node N35 is switched from the voltage V2 to the voltage V3 at the timing t4 and the voltage at the node N35 is switched from the voltage V1 to the voltage V3 at the timing t6. That is, the control circuit 82 transfers a control signal to the switch SW12 or SW11 so that the switch SW12 or SW11 in the on state turns off in order to electrically disconnect the node N32 or N31 from the node N35. During the time period Δt after the switch SW12 or SW11 turns off and before the switch SW11 in the off state turns on, the control circuit 82 transfers a control signal to the discharging circuit T2a so that the discharging circuit T2a turns on and a current flows rapidly from the node N35 to the node N37. It is thereby possible to decrease the discharging time period, namely to increase the speed of the voltage switching operation.

In the constant voltage generation circuit 80 of the second embodiment, the charging circuit T1a and the discharging circuit T2a are separated in configuration from the ladder resister comprising the resistors LR11 to LR14 from which the output voltage is provided. However, the present invention is not limited by this configuration. For example, it is possible for the constant voltage generation circuit to have only one of the charging circuit T1a and the discharging circuit T2a. Furthermore, it is possible to form the charging circuit T1a and the discharging circuit T2a by one circuit in order to perform the charging operation and the discharging operation rapidly in the voltage switching operation.

Moreover, it is possible to obtain the same effect when the resistors LR11 to LR14 as the voltage generation means comprises active elements such as capacitors and the like.

Furthermore, when the constant voltage generation circuit 80 of the second embodiment shown in FIG. 3 is incorporated in the A/D converter shown in FIG. 7, like the operation of the constant voltage generation circuit 8 of the first embodiment, the control circuit 82 in the constant voltage generation circuit 80 receives the control signal 7 and the comparison result 6, that have been explained in the first embodiment and in the prior art section, and may output a desired reference voltage 4 to the comparator 9. In this case, like the constant voltage generation circuit 8 of the first embodiment shown in FIG. 1, it is possible to incorporate the constant voltage generation circuit 80 into the A/D converter without any changing of the configuration of the A/D converter, for example, without adding any line for each control signal. Therefore it is possible for the A/D converter incorporating the constant voltage generation circuit 80 to rapidly perform the voltage switching operation by using the available signal lines for the control signal 7 indicating the reference time and for the comparison result 6.

As described above, according to the constant voltage generation circuit 80 of the second embodiment, during the voltage switching operation in which the voltage at the node N35 is switched to other voltage, it is possible to increase the voltage switching speed by connecting the charging circuit T1a or the discharging circuit T2a to the node N35 under the control of the control circuit 82. That is, it is possible to rapidly perform the charging operation or the discharging operation for the node N35 through the node N36 or the node N37 instead of the resistors LR11 to LR14 as the voltage generation means.

It is possible, based on the comparison result 6 transferred from the comparator 9 shown in FIG. 7 (see the signal path designated by the dotted line shown in FIG. 3) by the charging circuit T1a or the discharging circuit T2a during an optional time period under the control of the control circuit 82, to determine whether the level of the reference voltage 4 to be used in a following comparison operation becomes higher or lower than that of the reference voltage 4 that has currently been used by the comparator 9. That is, it is possible to increase the voltage difference between the voltage applied to the node N35 and the target voltage in the voltage switching operation and it is possible to increase a current that flows into or from the node N35 during the charging operation or the discharging operation. Therefore it is possible to decrease the time period required for the voltage switching operation.

Furthermore, according to the constant voltage generation circuit 80 of the second embodiment, even if the charging or discharging operation of the node N35 including the parasitic capacitance C1 belonging or associated with the output terminal OT can not be completed during a desired time period when the voltages of the power sources applied to both the nodes N30 and N34 of the resistors LR11 and LR14 are small in magnitude and when the magnitude of a current that flows between the node N35 and one of the nodes N31 to N33 through which one of target voltages generated at the resistors LR11 to LR14 as the voltage generation means is supplied to the node N35 is small by the voltage drop generated at the resistors LR11 to LR14, the maximum voltage is supplied to the node N35 by the charging circuit T1a or the discharging circuit T2a in order to charge or discharge the node N35 and the parasitic capacitance C1 under the control of the control circuit 82. It is possible to decrease the time period required for the charging and discharging operation to the node N35 and the parasitic capacitance C1.

As described above, according to the present invention, it is possible to reduce the voltage switching operation of a voltage output from the constant voltage generation circuit having a simple configuration and it is also possible to incorporate the constant voltage generation circuit into devices such as an A/D converter without any changing the configuration of the devices.

Furthermore, according to the present invention, even if the charging or discharging operation of a node and a parasitic capacitance connected to an output terminal can not be completed during a desired time period when a voltages of a power source applied to both nodes between resistors as voltage generation means is small in magnitude and when the magnitude of a current between the node connected to the output terminal and the node of the registers is supplied to the node N35 is small by the voltage drop generated at the resistors, it is possible to perform the rapid charging and discharging operation of the output terminal by the charging circuit or the discharging circuit. It is thereby possible to operate the constant voltage generation circuit in a low voltage and it is also possible to incorporate the constant voltage generation circuit to available devices without any changing configuration.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A constant voltage generation circuit comprising:
   a plurality of voltage generation means connected in series, both sides of which voltages of power sources are applied;
   a plurality of switches for selecting voltages generated at nodes among the plurality of voltage generation means in a voltage switching operation and for providing the selected voltage to an output terminal;
   a charging means connected to one of the sides of the plurality of voltage generation means for generating and supplying a charging voltage whose level is higher than a level of the highest voltage generated by the plurality of voltage generation means;
   a charging means switch for connecting the charging means to the output terminal during a voltage switching operation in which one of the nodes among the plurality of voltage generation means that is currently connected to the output terminal is switched to another node whose voltage is higher than the current voltage of the output terminal;
   a discharging means connected to the other side of the plurality of voltage generation means for generating and supplying a discharging voltage whose level is smaller than a level of the lowest voltage generated by the plurality of voltage generation means; and
   a discharging means switch for connecting the discharging means to the output terminal during a voltage switching operation in which one of the nodes among the plurality of voltage generation means that is currently connected to the output terminal is switched to another node whose voltage is lower than the current voltage of the output terminal.

2. A constant voltage generation circuit as claimed in claim 1, further comprising control means for controlling operations of the plurality of switches, the charging means switch, and the discharging means switch so that the charging means is electrically connected to the output terminal, or the discharging means is electrically connected to the output terminal during a time in which any one of the plurality of voltage generation means is not connected to the output terminal in the voltage switching operation.

3. A constant voltage generation circuit as claimed in claim 2, wherein during the voltage switching operation, the control means controls a switching operation of the plurality of switches, the charging means switch, and the discharging means switch so that the charging means is electrically connected to the output terminal and the discharging means is electrically connected to the output terminal during a charging operation or a discharging operation for the output terminal and during a time period overlapped with a time period before one of the plurality of voltage generation means is electrically disconnected from the output terminal at a start of the voltage switching operation.

4. A constant voltage generation circuit as claimed in claim 3, wherein during the voltage switching operation, the control means controls a switching operation of the plurality of switches, the charging means switch, and the discharging means switch so that the charging means is electrically connected to the output terminal and the discharging means is electrically connected to the output terminal during a charging operation or a discharging operation for the output terminal and during a time period overlapped with a time period after one of the plurality of voltage generation means is electrically connected to the output terminal at a completion of the voltage switching operation.

5. A constant voltage generation circuit as claimed in claim 3, wherein each of the charging means and the discharging means comprises a metal oxide semiconductor transistor.

6. A constant voltage generation circuit as claimed in claim 2, wherein during the voltage switching operation, the control means controls a switching operation of the plurality of switches, the charging means switch and the discharging means switch so that the charging means is electrically connected to the output terminal and the discharging means is electrically connected to the output terminal during a charging operation or a discharging operation for the output terminal and during a time period overlapped to a time period after one of the plurality of voltage generation means is electrically connected to the output terminal at a completion of the voltage switching operation.

7. A constant voltage generation circuit as claimed in claim 2, wherein each of the charging means and the discharging means comprises a metal oxide semiconductor transistor.

8. A constant voltage generation circuit as claimed in claim 1, wherein each of the charging means and the discharging means comprises a metal oxide semiconductor transistor.

9. A constant voltage generation circuit comprising:
   a plurality of voltage generation means connected in series, wherein voltages of power sources are applied to both sides of the plurality of voltage generation means;
   a plurality of switches for selecting voltages generated at nodes among the plurality of voltage generation means in a voltage switching operation and for providing the selected voltage to an output terminal;
   a charging means placed in a section separated from the plurality of voltage generation means and for generating and supplying a charging voltage whose level is higher than a level of the highest voltage generated by the plurality of voltage generation means;
   a charging means switch for connecting the charging means to the output terminal during a voltage switching operation in which one of the nodes among the plurality of voltage generation means that is currently connected to the output terminal is switched to another node whose voltage is higher than the current voltage of the output terminal;
   a discharging means placed in a section separated from the plurality of voltage generation means and for generating and supplying a discharging voltage whose level is smaller than a level of the lowest voltage generated by the plurality of voltage generation means; and
   a discharging means switch for connecting the discharging means to the output terminal during a voltage switching operation in which one of the nodes among the plurality of voltage generation means that is currently connected to the output terminal is switched to another node whose voltage is lower than the current voltage of the output terminal.

10. A constant voltage generation circuit as claimed in claim 9, further comprising control means for controlling operations of the plurality of switches, the charging means switch, and the discharging means switch so that the charging means is electrically connected to the output terminal, or the discharging means is electrically connected to the output terminal during a time in which any one of the plurality of voltage generation means is not connected to the output terminal in the voltage switching operation.

11. A constant voltage generation circuit as claimed in claim 10, wherein during the voltage switching operation, the control means controls a switching operation of the plurality of switches, the charging means switch, and the discharging means switch so that the charging means is electrically connected to the output terminal and the discharging means is electrically connected to the output terminal during a charging operation or a discharging operation for the output terminal and during a time period overlapped with a time period before one of the plurality of voltage generation means is electrically disconnected from the output terminal at a start of the voltage switching operation.

12. A constant voltage generation circuit as claimed in claim 11, wherein during the voltage switching operation, the control means controls a switching operation of the plurality of switches, the charging means switch, and the discharging means switch so that the charging means is electrically connected to the output terminal and the discharging means is electrically connected to the output terminal during a charging operation or a discharging operation for the output terminal and during a time period overlapped with a time period after one of the plurality of voltage generation means is electrically connected to the output terminal at a completion of the voltage switching operation.

13. A constant voltage generation circuit as claimed in claim 11, wherein each of the charging means and the discharging means a metal oxide semiconductor transistor.

14. A constant voltage generation circuit as claimed in claim 10, wherein during the voltage switching operation, the control means controls a switching operation of the plurality of switches, the charging means switch, and the discharging means switch so that the charging means is electrically connected to the output terminal and the discharging means is electrically connected to the output terminal during a charging operation or a discharging operation for the output terminal and during a time period overlapped with a time period after one of the plurality of voltage generation means is electrically connected to the output terminal at a completion of the voltage switching operation.

15. A constant voltage generation circuit as claimed in claim 10, wherein each of the charging means and the discharging means comprises a metal oxide semiconductor transistor.

16. A constant voltage generation circuit as claimed in claim 9, wherein each of the charging means and the discharging means comprises a metal oxide semiconductor transistor.

* * * * *